(12) United States Patent
Xie et al.

(10) Patent No.: US 9,147,748 B1
(45) Date of Patent: Sep. 29, 2015

(54) METHODS OF FORMING REPLACEMENT SPACER STRUCTURES ON SEMICONDUCTOR DEVICES

(71) Applicant: GLOBALFOUNDRIES Inc., Grand Cayman (KY)

(72) Inventors: Ruilong Xie, Niskayuna, NY (US); Xiuyu Cai, Niskayuna, NY (US); Ajey Poovannummoottil Jacob, Watervliet, NY (US); Andreas Knorr, Wappingers Falls, NY (US); Christopher Prindle, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/267,555

(22) Filed: May 1, 2014

(51) Int. Cl.
| | |
|---|---|
| *H01L 21/283* | (2006.01) |
| *H01L 29/66* | (2006.01) |
| *H01L 21/311* | (2006.01) |
| *H01L 21/285* | (2006.01) |
| *H01L 29/45* | (2006.01) |
| *H01L 29/51* | (2006.01) |
| *H01L 29/49* | (2006.01) |
| *H01L 29/06* | (2006.01) |
| *H01L 29/78* | (2006.01) |

(52) U.S. Cl.
CPC .... *H01L 29/66545* (2013.01); *H01L 21/28518* (2013.01); *H01L 21/31111* (2013.01); *H01L 29/0649* (2013.01); *H01L 29/456* (2013.01); *H01L 29/495* (2013.01); *H01L 29/4966* (2013.01); *H01L 29/517* (2013.01); *H01L 29/665* (2013.01); *H01L 29/6656* (2013.01); *H01L 29/78* (2013.01)

(58) Field of Classification Search
USPC .......................................... 257/355
See application file for complete search history.

(56) References Cited

U.S. PATENT DOCUMENTS

| | | | | |
|---|---|---|---|---|
| 6,235,627 | B1 * | 5/2001 | Nakajima | 438/638 |
| 8,436,404 | B2 * | 5/2013 | Bohr et al. | 257/288 |
| 8,524,592 | B1 * | 9/2013 | Xie et al. | 438/595 |
| 8,753,970 | B2 * | 6/2014 | Xie et al. | 438/595 |
| 2011/0108930 | A1 * | 5/2011 | Cheng et al. | 257/412 |
| 2014/0015014 | A1 * | 1/2014 | Cheng et al. | 257/288 |
| 2014/0070285 | A1 * | 3/2014 | Xie et al. | 257/288 |

* cited by examiner

*Primary Examiner* — Marc Armand
*Assistant Examiner* — Younes Boulghassoul
(74) *Attorney, Agent, or Firm* — Amerson Law Firm, PLLC

(57) ABSTRACT

One illustrative method disclosed herein includes removing the sidewall spacers and a gate cap layer so as to thereby expose an upper surface and sidewalls of a sacrificial gate structure, forming an etch stop layer above source/drain regions of a device and on the sidewalls and upper surface of the sacrificial gate structure, forming a first layer of insulating material above the etch stop layer, removing the sacrificial gate structure so as to define a replacement gate cavity that is laterally defined by portions of the etch stop layer, forming a replacement gate structure in the replacement gate cavity, and forming a second gate cap layer above the replacement gate structure.

14 Claims, 13 Drawing Sheets

METHODS OF FORMING REPLACEMENT SPACER STRUCTURES ON SEMICONDUCTOR DEVICES

BACKGROUND OF THE INVENTION

1. Field of the Invention

The present disclosure generally relates to the fabrication of integrated circuits, and, more particularly, to various methods of forming replacement spacer structures on a semiconductor device.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Typically, a high performance integrated circuit product, such as a high performance microprocessor, will contain billions of individual field effect transistors (FETs). The transistors are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region of the transistor. The transistor devices come in a variety of forms, e.g., so-called planar transistor devices, 3D or FinFET devices, etc.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid so-called short channel effects which may be associated with the use of traditional silicon-based materials in reduced channel length transistors. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in such metal gate structures. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in metal gate structures so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), etc. One well-known processing method that has been used for forming a transistor with a metal gate structure is the so-called "gate-last" or "replacement gate" technique. The replacement gate process may be used when forming planar devices or 3D devices. At a very high level, the replacement gate process involves: (1) forming a sacrificial or dummy gate structure above a substrate with a cap layer positioned thereabove; (2) forming sidewall spacers adjacent the sacrificial gate structure; (3) forming source/drain regions for the device (which may include the formation of epi semiconductor material in the source/drain regions of the device); (4) forming a layer of insulating material across the device; (5) removing the gate cap layer positioned above the sacrificial gate structure; (6) removing the sacrificial gate structure so as to define a gate cavity; (7) forming a replacement metal gate structure in the gate cavity; and (8) forming a gate cap layer above the replacement metal gate structure.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced.

Typically, spacers on newer technology devices are made of a material having a dielectric constant (k) value that falls within the range of about 5 to 5.5, such as SiCN, SiBN, etc. However, it would be desirable to use a spacer having a lower k value to reduce the parasitic capacitance between the gate structure and the source/drain contact. For example, making the spacers from silicon dioxide (k value of about 3.9) would reduce the gate-tocontact capacitance and reduce the AC delay of a circuit. However, a silicon dioxide spacer is not compatible with current replacement gate (RMG) processing techniques that include a wet clean process or with self-aligned contact (SAC) etch processing flows. One prior technique that has been employed in an effort to obtain a silicon dioxide spacer that is not subjected to damage during the RMG gate pre-clean process or the typical SAC contact etch processing sequence is described below in FIGS. 1A-1F.

FIGS. 1A-1F schematically illustrate an illustrative prior art transistor device and various problems that may arise when forming conductive contacts to such a device. As shown in FIG. 1A, the device 10 is formed above an active region that is defined in a semiconductor substrate 12 by an isolation structure (not shown), such as a shallow trench isolation structure. The device 10 includes a gate structure comprised of a gate insulation layer 13, a gate electrode 14, a gate cap layer 16, sidewall spacers 18, a layer of insulating material 22 and raised source/drain regions 20. The sidewall spacers 18 and the gate cap layer 16 are typically made of silicon nitride, while the layer of insulating material 22 is typically made of silicon dioxide.

As shown in FIG. 1B, a contact etching process was performed to define a contact opening 24 in the layer of insulating material 22. Although a single contact opening 24 is depicted in the figures, those skilled in the art will appreciate that there will be another such contact opening 24 formed on the opposite side of the gate structure. As part of this contact etching process, after the contact opening 24 is formed in the layer of insulating material 22, a brief "punch through" etch process is typically performed to remove a very thin underlying silicon nitride layer (not shown)—a so-called contact etch stop layer—that is positioned above the source/drain regions. As depicted in the dashed-line region 26, some of the spacer 18 is consumed during one or both of these etching processes. Moreover, an isotropic etching process is typically performed to insure that all of the relatively higher k value silicon nitride spacer material is removed from the gate sidewall prior to the formation of the more desirable low-k spacer. The spacer 18 and the gate cap layer 16 serve a vital role in protecting the gate structure from damage during subsequent processing operations. FIG. 1C depicts an illustrative situation wherein substantially all of the spacer 18 and a portion of the gate cap layer 16 were removed during the contact etching process. As depicted in the dashed-line region 28, in this situation, portions of the gate structure 13, 14 may be exposed.

In an attempt to avoid the situation depicted in FIG. 1C, device manufacturers have formed single sidewall spacers 30 (see FIG. 1D) in the contact opening 24 to insure that the gate structure is protected. The spacers 30 may be formed by conformably depositing a layer of spacer material and thereafter performing an anisotropic etching process.

In the embodiment shown in FIGS. 1B-1D, the contact opening 24 is substantially properly aligned (or only slightly misaligned) in comparison to the intended location of the contact opening 24 relative to the location of the source/drain region 20 and the gate structure of the device 10. FIGS. 1E-1F depict an embodiment wherein a contact opening 24A is substantially misaligned in comparison to the intended location of the contact opening 24A relative to the location of the source/drain region 20 and the gate structure of the device 10. More specifically, after formation of the contact opening 24A, a significant portion of the gate structure may be exposed in the region indicated by the arrow 19. In FIG. 1F, the above-described prior art processing technique was performed in an effort to form spacers 30 in the contact opening 24A to protect the gate structure. However, due to the significant misalignment of the opening 24A, and the nature of the manner in which the spacers 30 are formed, two separate spacers 30A, 30B are formed above and adjacent the gate structure, respectively. Due to the significant misalignment of the contact opening 24A, portions of the gate structure may remain exposed, as depicted in the dashed-line region 32, or have only a very minimal amount of spacer material protecting the gate structure in subsequent processing operations. Such a situation can lead to undesirable electrical short circuits that can effectively destroy the functionality of an electronic circuit that includes such a transistor device.

The present disclosure is directed to various methods of forming replacement spacer structures on a semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement spacer structures on a semiconductor device. One illustrative method disclosed herein includes, among other things, forming a structure above a semiconductor substrate, the structure comprising a sacrificial gate structure, a first gate cap layer positioned above the sacrificial gate structure and first sidewall spacers positioned adjacent the sacrificial gate structure, removing the first sidewall spacers and the first gate cap layer so as to thereby expose an upper surface and sidewalls of the sacrificial gate structure, forming an etch stop layer above source/drain regions of the device and on the sidewalls and upper surface of the sacrificial gate structure, forming a first layer of insulating material above the etch stop layer, removing the sacrificial gate structure so as to define a replacement gate cavity that is laterally defined by portions of the etch stop layer, forming a replacement gate structure in the replacement gate cavity, and forming a second gate cap layer above the replacement gate structure.

More detailed embodiments of the various inventions disclosed herein further include, among other things, after forming the replacement gate structure, forming a first contact opening that extends through at least the first layer of insulating material so as to thereby expose a source/drain region of the device, forming a spacer in the first contact opening, and forming a first conductive contact in the contact opening.

Other more detailed methods disclosed herein further include, among other things, after forming the replacement gate structure, forming a second layer of insulating material above the second cap layer, forming a first contact opening that extends through at least the first and second layers of insulating material so as to thereby expose a source/drain region of the device, forming at least one spacer in the first contact opening, and forming a first conductive contact in the first contact opening.

Still other more detailed methods disclosed herein further include, among other things, after forming the replacement gate structure, forming a first contact opening that extends through at least the first layer of insulating material so as to thereby expose a source/drain region of the device, forming at least one spacer in the first contact opening, forming a first conductive contact in the first contact opening, forming a second layer of insulating material above the second cap layer and the first conductive contact, forming a second contact opening that extends through at least the second layer of insulating material so as to thereby expose at least a portion of the first conductive contact, and forming a second conductive contact in the second contact opening, wherein the second conductive contact is conductively coupled to the first conductive contact.

One illustrative novel device disclosed herein includes, among other things, an isolation region positioned in a semiconductor substrate that defines an active region in the semiconductor substrate, a gate structure having a lateral width and opposing first and second sidewalls, wherein a first portion of the lateral width of the gate structure is positioned above the isolation region and a second portion of the lateral width of the gate structure is positioned above the active region, an L-shaped liner layer positioned on the isolation region and on the first sidewall of the gate structure and a sidewall spacer positioned above the active region and on the second sidewall of the gate structure.

BRIEF DESCRIPTION OF THE DRAWINGS

The disclosure may be understood by reference to the following description taken in conjunction with the accompanying drawings, in which like reference numerals identify like elements, and in which.

Figure 1A:
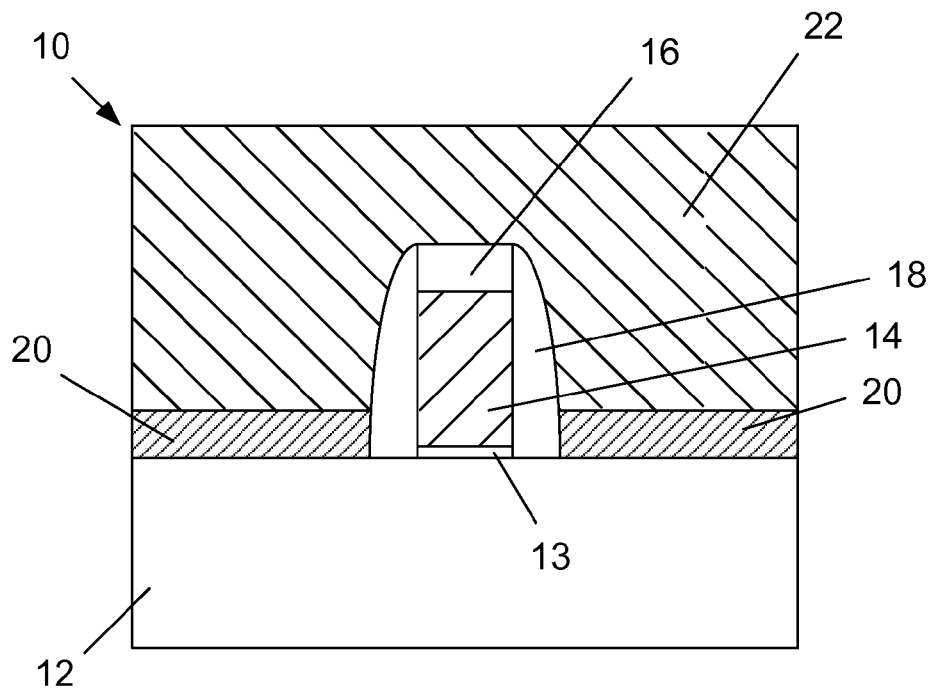
FIGS. 1A-1F schematically illustrate an illustrative prior art transistor device and various problems that may arise when forming conductive contacts to such a device.
Figure 1B:
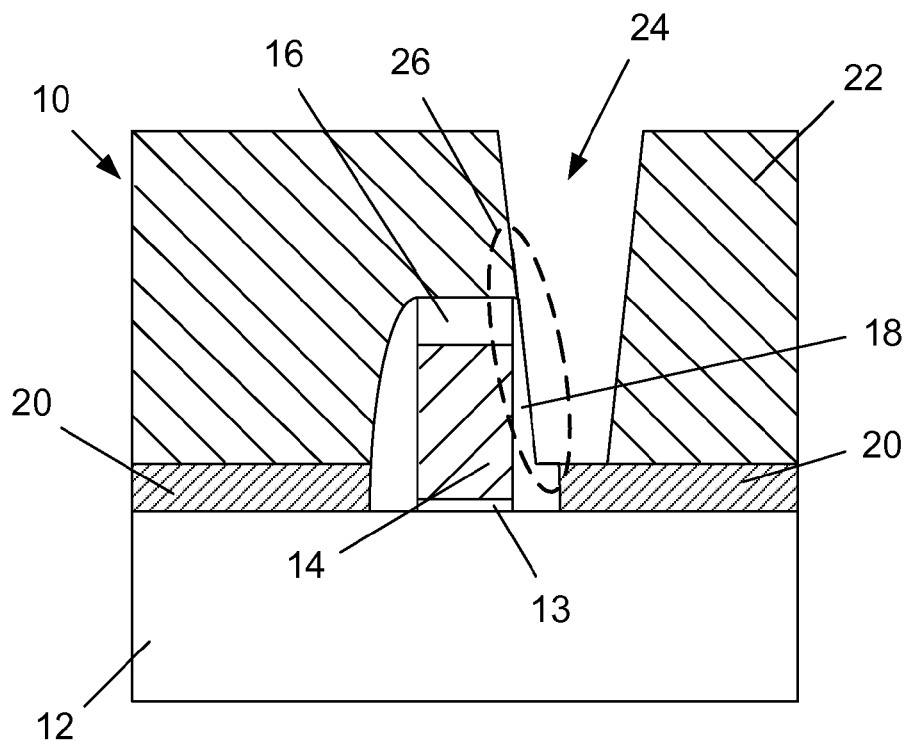
Figure 1C:
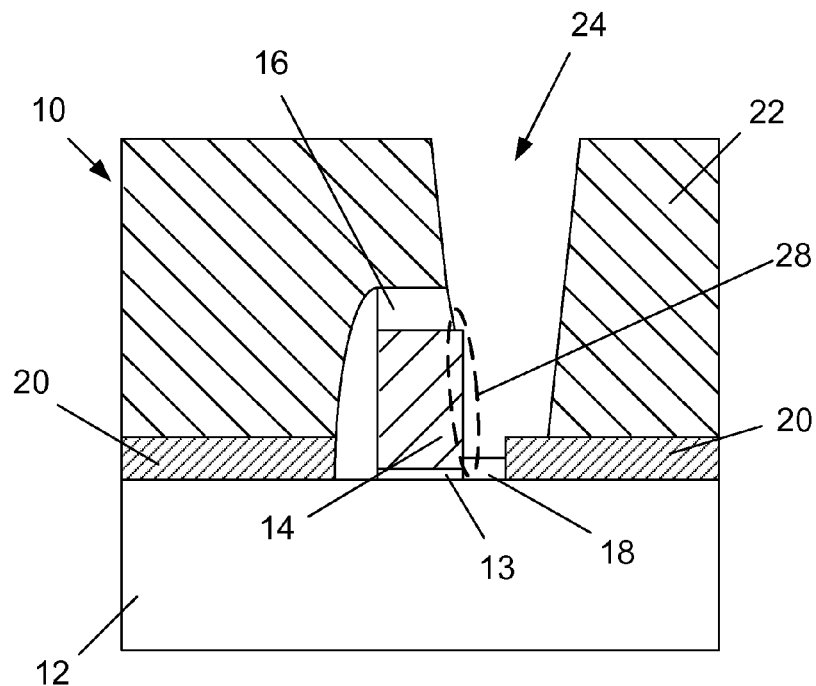
Figure 1D:
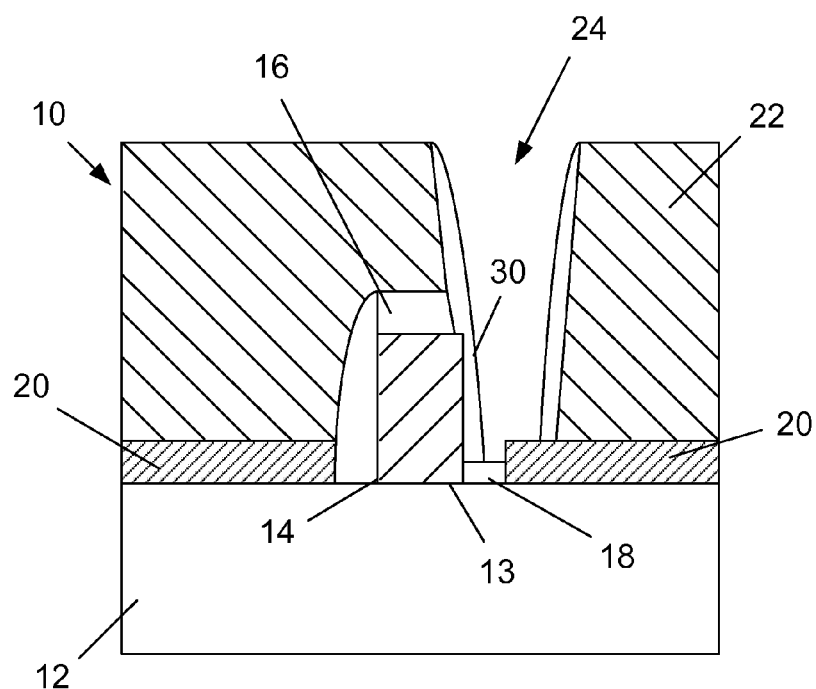
Figure 1E:
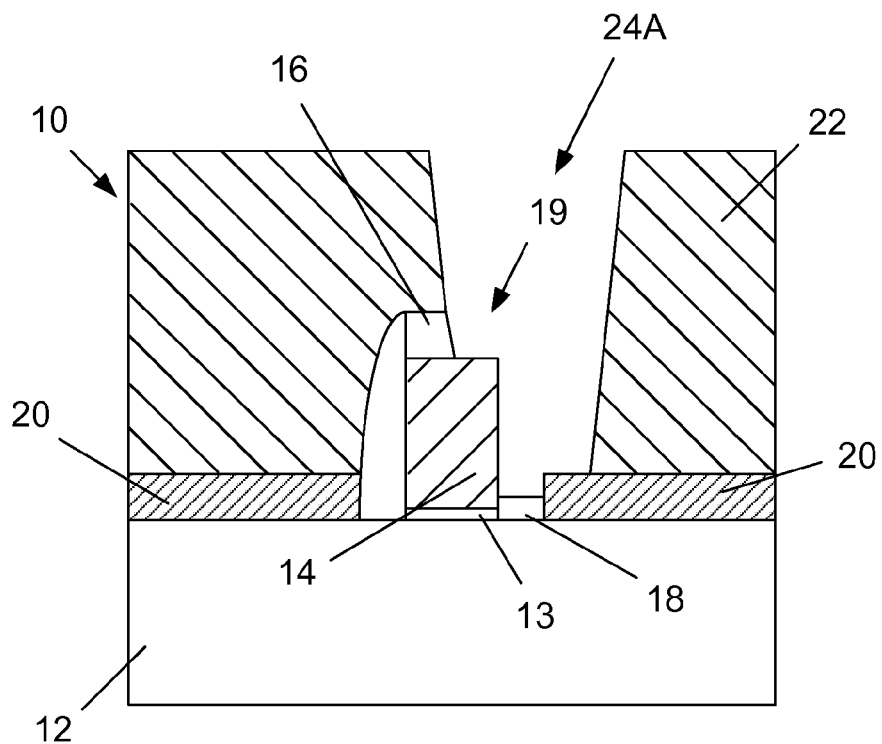
Figure 1F:
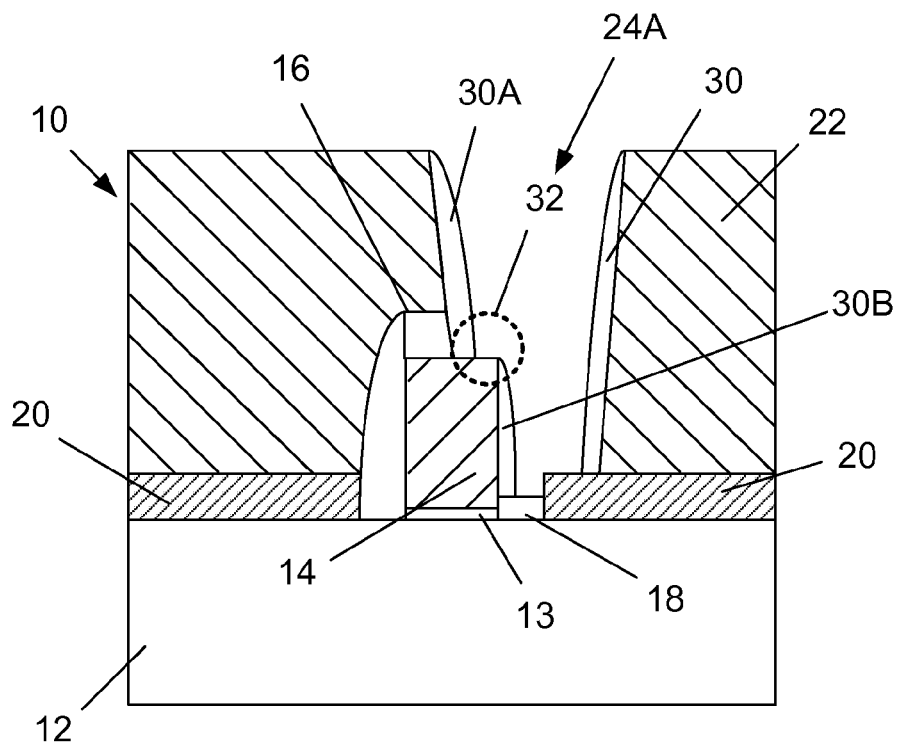

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming replacement spacer structures on a semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc.

As will be appreciated by those skilled in the art after a complete reading of the present application, the methods and structures disclosed herein may be used when forming either planar or 3D transistor devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2A:
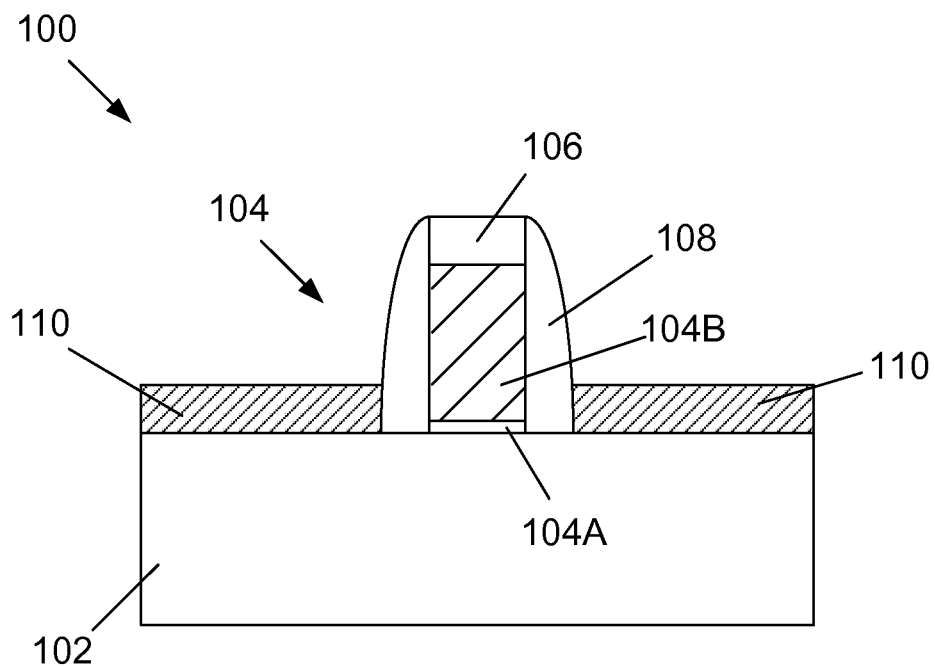
FIGS. 2A-2K depict one illustrative method disclosed herein of forming replacement spacer structures on a semiconductor device.

FIGS. 2A-2K depict one illustrative method disclosed herein of forming replacement spacer structures on a semiconductor device 100. FIG. 2A schematically illustrates a cross-sectional view of a transistor device 100 at an advanced stage of manufacturing. The device 100 is formed above a semiconductor substrate 102 and includes a sacrificial gate structure 104 comprised of a sacrificial gate insulation layer 104A, a sacrificial gate electrode 104B, a gate cap layer 106, sidewall spacers 108 and illustrative raised source/drain regions 110. The sidewall spacers 108 and the gate cap layer 106 are typically made of silicon nitride. The substrate 102 may have a variety of configurations, such as the depicted bulk substrate configuration. The substrate 102 may have an SOI (silicon-on-insulator) configuration wherein the semiconductor devices are formed in the active layer of the SOI substrate. The substrate 102 may be made of silicon or it may be made of materials other than silicon. Thus, the terms "substrate," "semiconductor substrate" or "semiconducting substrate" should be understood to cover all semiconducting materials and all forms of such materials.

With continuing reference to FIG. 2A, the sacrificial gate structure 104 is intended to be representative in nature of any type of gate structure that may be employed in manufacturing integrated circuit products using so-called gate-last (replacement gate) manufacturing techniques. In general, the sacrificial gate structure 104 is comprised of one or more sacrificial gate insulation layers 104A, such as, for example, silicon dioxide, and one or more conductive material layers that act as the sacrificial gate electrode 104B, e.g., polysilicon, amorphous silicon, etc. The sacrificial gate structure 104, spacers 108 and gate cap layer 106 may be formed as generally described above in the background section of the application. The sacrificial gate structure 104 remains in place as many process operations are performed to form the device 100, e.g., the formation of the raised, doped source/drain regions 110, performing an anneal process to repair damage to the substrate 102 caused by the ion implantation processes and to activate the implanted dopant materials, etc.

Figure 2B:
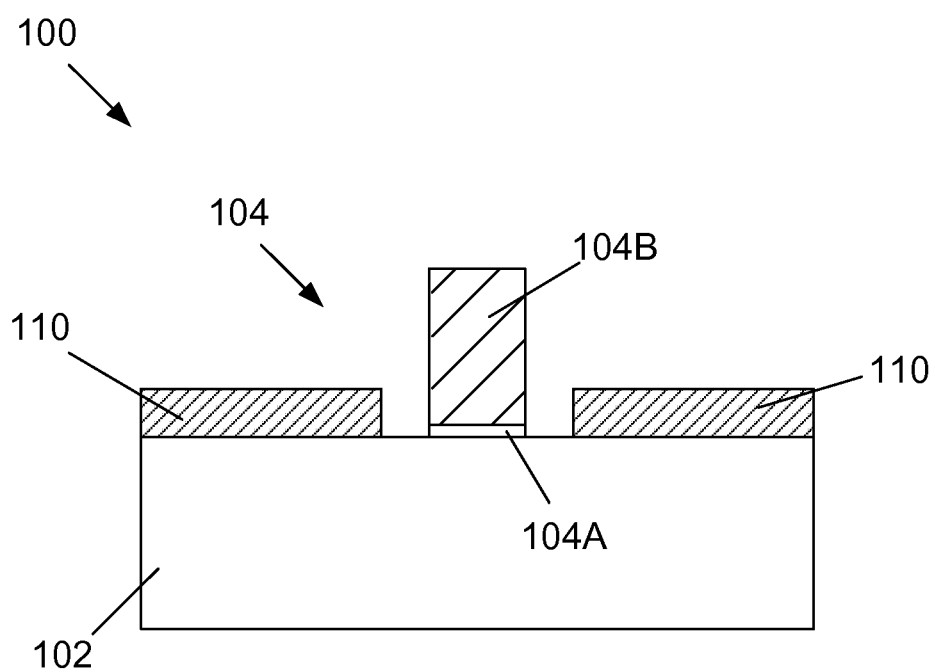

FIG. 2B depicts the device 100 after one or more etching processes were performed to remove the sidewall spacers 108 and the gate cap layer 106. This etching process exposes the upper surface and the sidewalls of the sacrificial gate structure 104.

Figure 2C:
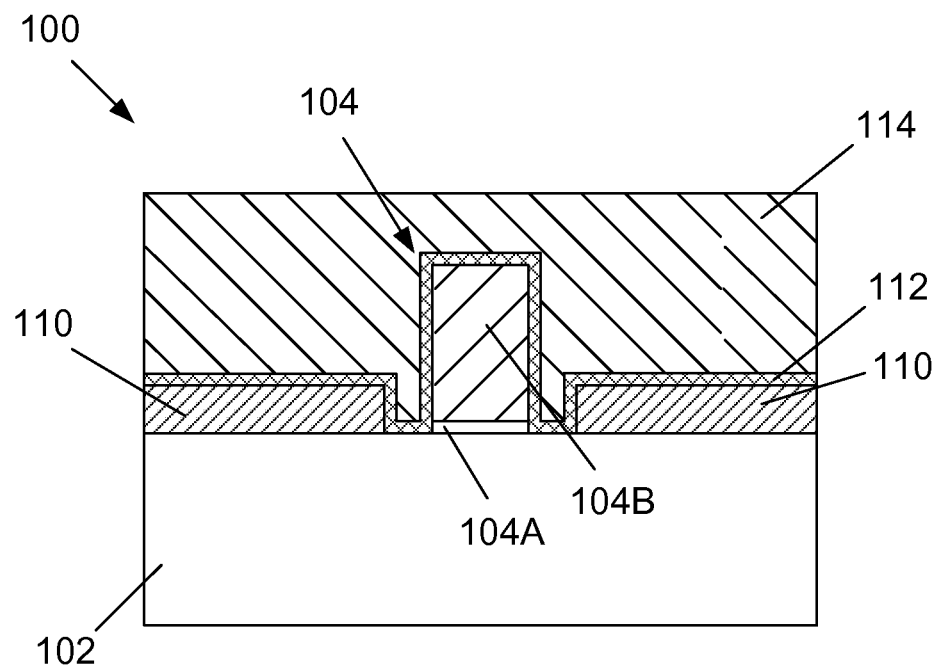

FIG. 2C depicts the device after a thin etch stop layer 112, e.g., silicon nitride, and a layer of insulating material 114, e.g., silicon dioxide, were formed on the device 100. The etch stop layer 112 may be formed by performing a conformal deposition process, e.g., CVD, ALD. As depicted, the etch stop layer 112 is formed on the exposed sidewalls and the exposed upper surface of the sacrificial gate structure 104. The etch stop layer 112 may be formed to any desired thickness, e.g., 2-5 nm. The layer of insulating material 114 may be comprised of a variety of different materials, such as silicon dioxide, etc., and it may be formed by performing a variety of techniques, e.g., CVD, etc. The thickness of the layer of insulating material 114 may vary depending upon the particular application.

Figure 2D:
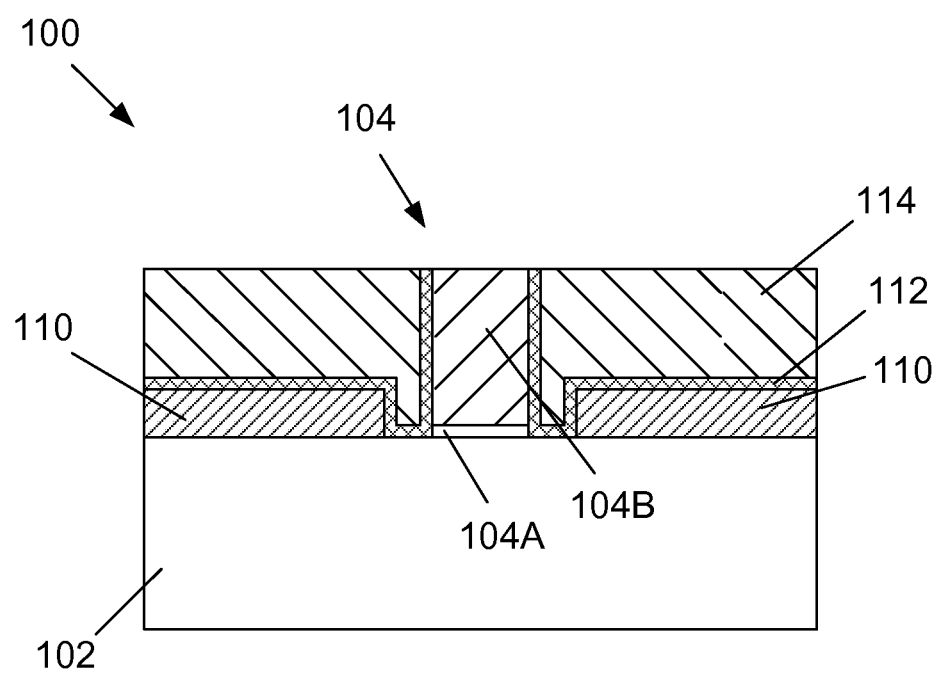

FIG. 2D depicts the product 100 after a CMP process was performed to remove the excess portions of the layer of insulating material 114 using the sacrificial gate structure 104 as a polish-stop. This process operation again exposes the upper surface of the sacrificial gate electrode 104B.

Figure 2E:
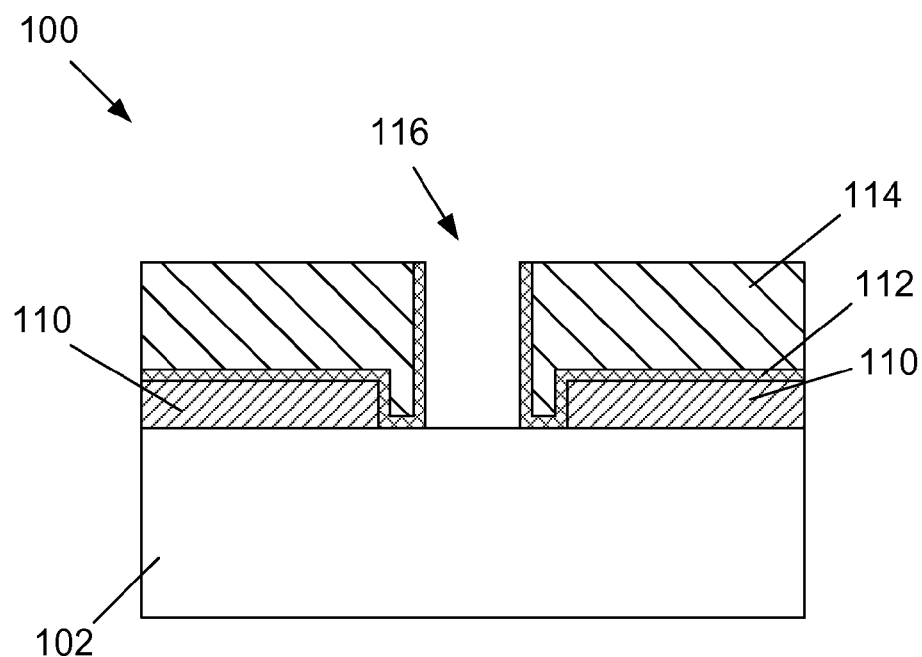

FIG. 2E depicts the device 100 after one or more etching processes were performed to remove the sacrificial gate structure 104 which results in the formation of a replacement gate cavity 116 that is laterally defined by the upstanding portions of the etch stop layer 112. A final replacement gate structure for the device 100 will be formed in the replacement gate cavity 116.

Figure 2F:
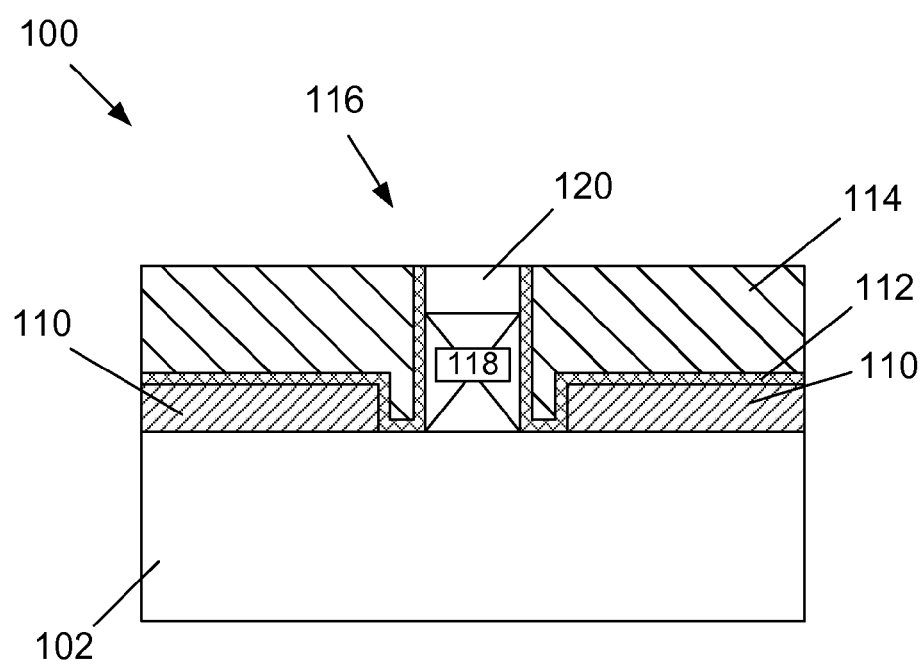

FIG. 2F depicts the device 100 after several process operations were performed that ultimately resulted in the formation of an illustrative and schematically depicted replacement (or final) gate structure 118 in the gate cavity 116, and the formation of a gate cap layer 120 above the replacement gate structure 118. The replacement gate structure 118 depicted herein is intended to be representative in nature of any type of gate structure that may be employed in manufacturing integrated circuit products.

Typically, in a replacement gate process flow, a pre-clean process will be performed in an attempt to remove all foreign materials from within the gate cavity 116 prior to forming the various layers of material that will become part of the gate structure 118. For example, the gate structure 118 may be formed by sequentially depositing the materials of the gate structure 118 in the gate cavity 116 and above the layer of material 114, performing a CMP process to remove excess materials above the layer 114, and then performing an etch-back recess etching process such that the upper surface of the gate structure 118 is at the desired height level within the gate cavity 116 so as to make room for the formation of the gate cap layer 120. At that point, the material of the gate cap layer 120 may be deposited across the device and above the recessed gate structure 118, and another CMP process may be performed to remove excess material from above the layer of insulating material 114 so as to thereby define the gate cap layer 120. As one specific example, the gate structure 118 may include a high-k (k value greater than 10) gate insulation layer (not separately shown), such as hafnium oxide, that is deposited across the device 100 and within the gate cavity 116. Thereafter, various conductive materials (not individually shown) may be formed in the gate cavity 116 above the high-k gate insulation layer. The conductive materials may comprise at least one work function adjusting metal layer (not separately shown), e.g., a layer of titanium nitride or TiAlC, depending upon the type of transistor device being manufactured, and more than one layer of work function metal may be formed in the gate cavity 116, depending upon the particular device under construction. Then, a bulk conductive material, such as tungsten or aluminum, may be deposited in the gate cavity 116 above the work function adjusting metal layer(s).

Figure 2G:
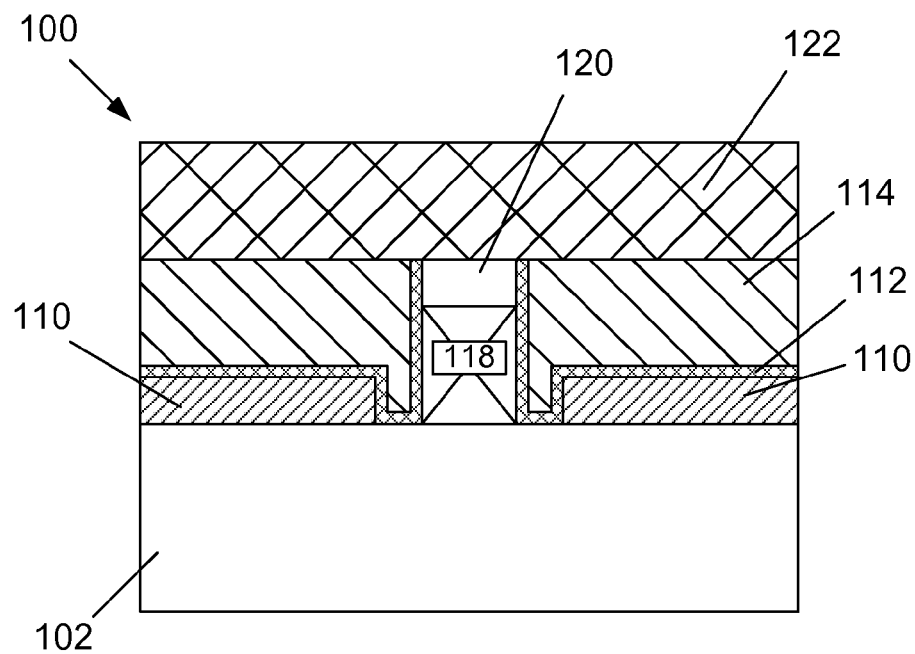

FIG. 2G depicts the product 100 after another layer of insulating material 122 was deposited across the product 100. The layer of insulating material 122 may be comprised of a variety of different materials, such as silicon dioxide, etc., and it may be formed by performing a variety of techniques, e.g., CVD, etc. The thickness of the layer of insulating material 122 may vary depending upon the particular application. The layer of insulating material 122 may be made of the same or a different material than that of the layer of insulating material 114.

Figure 2H:
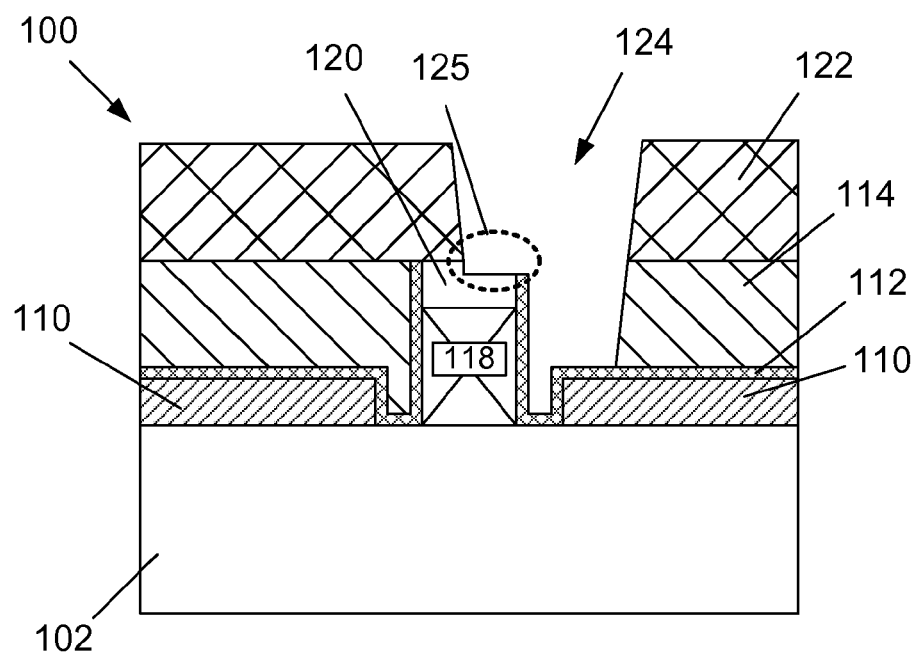

FIG. 2H depicts the device 100 after a contact etching process was performed to define a contact opening 124 in the layers of insulating material 122, 114. The contact opening 124 was formed by performing one or more etching processes through a patterned etch mask (not shown), such as a patterned layer of photoresist material. This contact etching process stops on the etch stop layer 112 and the gate cap layer 120, although some erosion or loss of the gate cap layer 120 and the exposed portions of the etch stop layer 112 will likely occur, as depicted in the dashed-line region 125. Although a single contact opening 124 is depicted in the figures, those skilled in the art will appreciate that there will be another such contact opening 124 formed on the opposite side of the gate structure 118. In the depicted embodiment, the contact opening 124 is substantially misaligned in comparison to the intended lateral location of the contact opening 124 relative to the location of the source/drain region 110 and the gate structure 118 of the device 100.

Figure 2I:
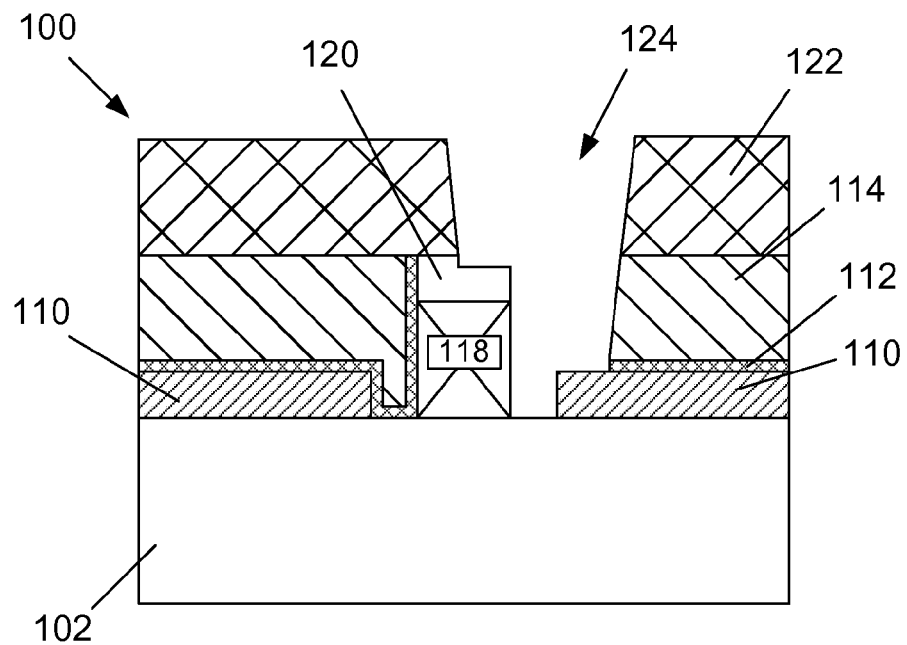

FIG. 2I depicts the device 100 after a brief isotropic etch process was performed to insure that the gate sidewall is cleared of the material of the etch stop layer 112 and to remove any residual portions of the etch stop layer 112 so as to insure that the source/drain region 110 is exposed and may be conductively contacted. These process operations likely expose the sidewalls of the final gate structure 118, e.g., the high-k gate insulation layer of the gate structure 118, given the way that the high-k gate insulation layer is conformably deposited in the gate cavity 116. Importantly, given that the etch stop layer 112 is very thin (e.g., 2-5 nm) as compared to a traditional sidewall spacer (e.g., 6-20 nm), the isotropic etching process is very brief and thus only very limited amounts of the gate cap layer 120 is removed as compared to the amount of the gate cap layer that was removed when a traditional, thicker sidewall spacer was completely removed.

Figure 2J:
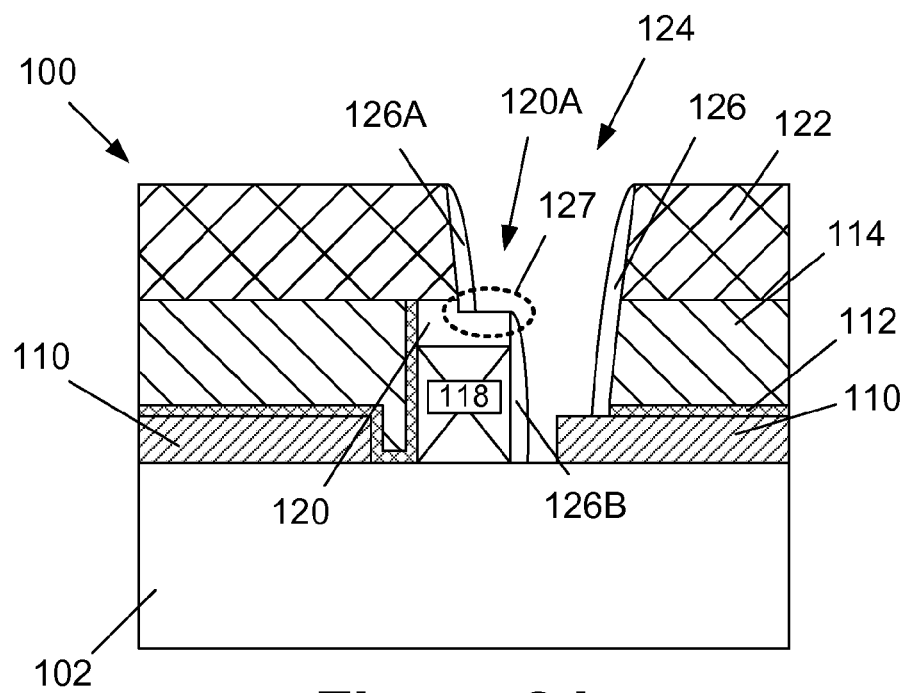

FIG. 2J depicts the device after replacement sidewall spacers, generally designated with the reference number 126, were formed in the contact opening 124 to insure that the gate structure 118 is protected. However, due to the significant misalignment of the opening 124, and the nature of the manner in which the spacers 126 are formed, two separate spacers 126A, 126B are formed above and adjacent the gate structure 118, respectively. The spacers 126 may be formed by conformably depositing a layer of spacer material and thereafter performing an anisotropic etching process. Given the unique process flow disclosed herein, the replacements spacers 126 may be made of a more desirable low-k material (a material having a dielectric constant of about 3.9 or less). As noted above, using the novel process flow described herein, the full-thickness, traditional spacers 108 are removed very early in the process flow, and the thin etch stop layer 112 is thereafter formed. The thin etch stop layer 112 may be completely removed while consuming less of the gate cap layer as compared to the amount of the gate cap layer removed when a full thickness spacer was removed, as was done in the prior art. The prior art processing that involved removal of the full thickness spacer removed too much of the gate cap layer, thereby leading to gate-tocontact shorts. Here, due to the presence of the thin etch stop liner 112, the contact etch processing sequence does not need to remove as much material as compared to the case of removing a full thickness spacer, thus the cap layer 120 will remain intact and protect the gate structure. By forming the replacement spacers 126 of a low-k material, the parasitic capacitance between the gate structure 118 and the conductive contact (not shown in FIG. 2J) may be reduced, as compared to the situation where the spacers were made of a higher-k value material such as silicon nitride. Note that, using the methods disclosed herein, even with significant misalignment of the contact opening 124, the corner of the gate structure 118 remains protected by the materials in the dashed-line region 127. This is due to the early removal of the spacers 108 and replacement of those spacers with the thin etch stop layer 112. In the prior art process flows, the thick spacer had to be removed before any lower-k value spacer could be formed in its place. In a self-aligned contact process flow, this involved performing a first contact etch process that would selectively remove silicon dioxide to the spacer (typically silicon nitride). Thereafter, an isotropic etching process was performed to remove all of the thick spacer from the gate sidewall. Due to the amount of the spacer material that had to be removed, excessive amounts of the gate cap layer (which is typically made of the same material as the spacer) was consumed, thereby leading to undesirable shorts. In the case where traditional prior art contacts were formed using a traditional masking and etching process, the contact opening was typically formed by performing an initial anisotropic etching process that was non-selective as between the silicon nitride spacer and gate cap and the silicon dioxide insulating material. After this anisotropic etching process was performed, an isotropic etching process was performed that removed silicon nitride selectively relative to silicon dioxide. As a result of this process flow, there was typically a large amount of the gate cap layer lost, which might result in the aforementioned gate-to-contact shorts.

Figure 2K:
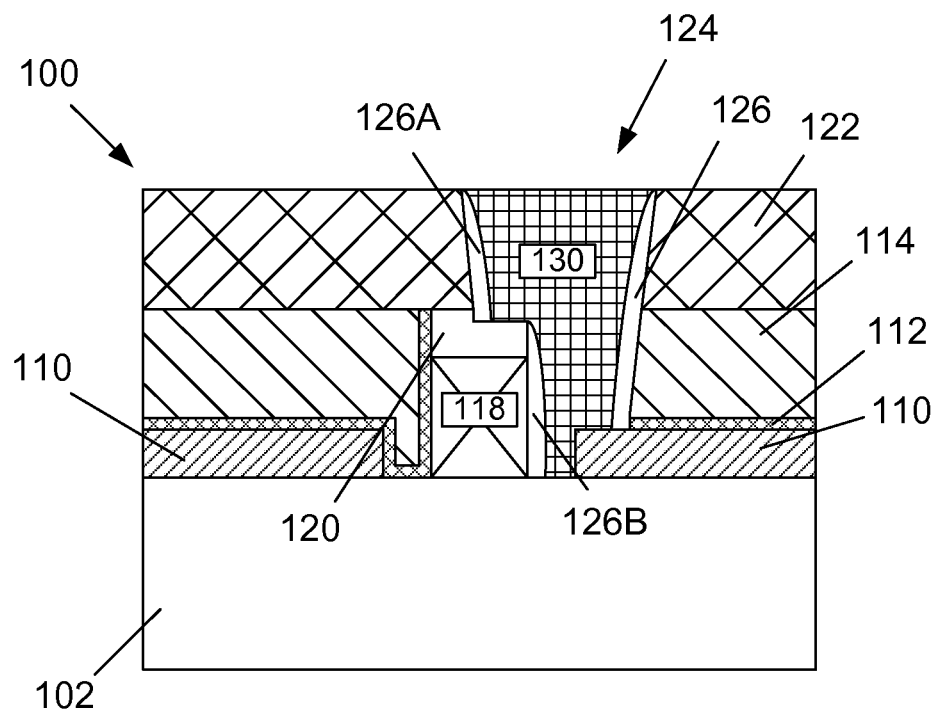

FIG. 2K depicts the device 100 after a conductive contact structure 130 was formed in the contact opening 124 such that it is conductively coupled to the source/drain region 110. The contact structure 130 is intended to be schematic and representative in nature, as it may be formed using any of a variety of different conductive materials and by performing traditional manufacturing operations. The contact structure 130 may also contain one or more barrier layers (not depicted), and, when present, such barrier layers should be considered to be part of the contact structure 130. In one illustrative example, the contact structure 130 may be formed by depositing a liner, e.g., a titanium nitride liner, followed by overfilling the contact opening 124 with a conductive material, such as tungsten. Thereafter, a CMP process may be performed to planarize the upper surface of the layer of insulating material 122, which results in the removal of excess portions of the liner and the tungsten positioned above the layer of insulating material 122 outside of the contact opening 124 and the formation of the contact structure 130. If desired, a metal silicide material (not shown) may be formed on the source/drain region 110 prior to forming the contact structure 130.

Figure 3A:
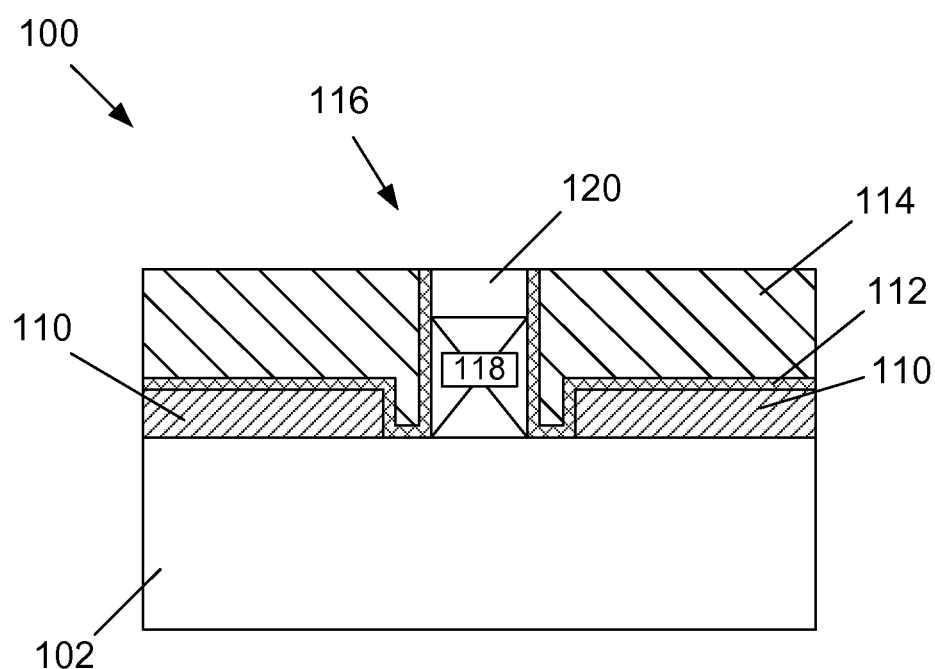
FIGS. 3A-3F depict another illustrative method disclosed herein of forming replacement spacer structures on a semiconductor device.

FIGS. 3A-3F depict another illustrative method disclosed herein of forming replacement spacer structures on a semiconductor device 100. FIG. 3A depicts the device 100 at a point in fabrication that corresponds to that shown in FIG. 2F, i.e., after the final gate structure 118 and the gate cap layer 120 were formed.

Figure 3B:
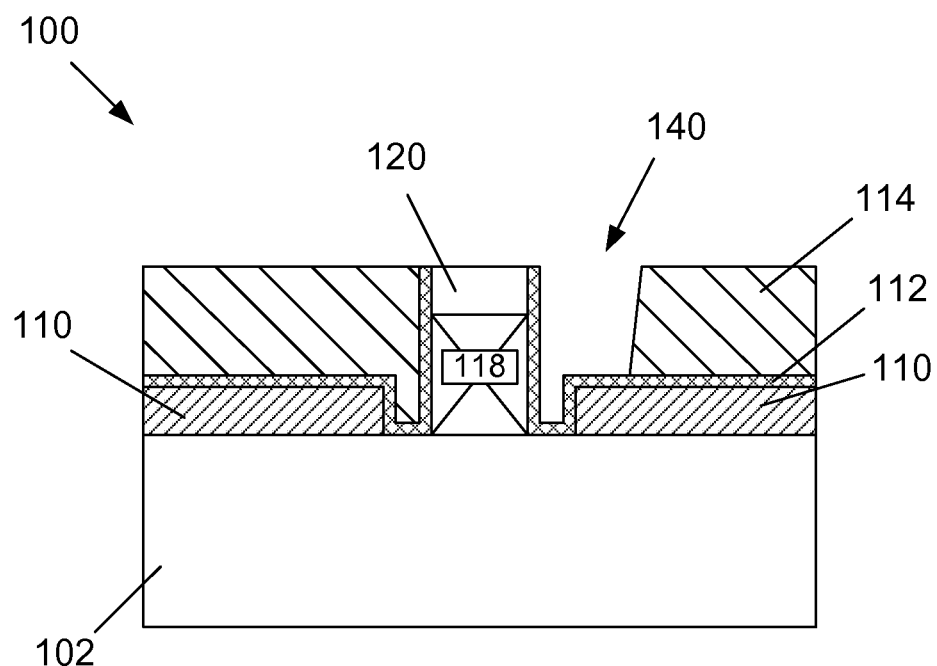

FIG. 3B depicts the device 100 after an etching process was performed to define a trench silicide opening 140 in the layer of insulating material 114. The trench silicide opening 140 was formed by performing one or more etching processes through a patterned etch mask (not shown), such as a patterned layer of photoresist material. This etching process stops on the etch stop layer 112 and the gate cap layer 120, although some erosion or loss of the gate cap layer 120 and the exposed portions of the etch stop layer 112 will likely occur, but such material loss is not depicted in the drawings. Although a single trench silicide opening 140 is depicted in the figures, those skilled in the art will appreciate that there will be another such trench silicide opening 140 formed on the opposite side of the gate structure 118.

Figure 3C:
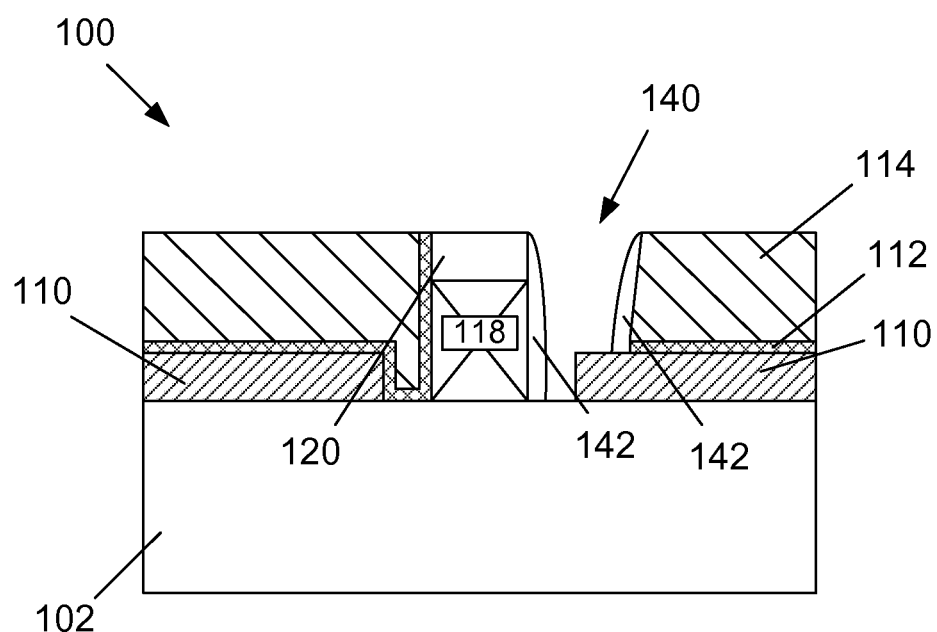

FIG. 3C depicts the device 100 after several process operations were performed. First, the above-described "punch through" etch process was performed to remove any residual portions of the etch stop layer 112 so as to insure that the source/drain region 110 is exposed and may be conductively contacted. This etching process likely exposes the sidewalls of the final gate structure 118, e.g., the high-k gate insulation layer of the gate structure 118, given the way that the high-k gate insulation layer is conformably deposited in the gate cavity 116. Thereafter, replacement sidewall spacers 142 were formed in the trench silicide opening 140 to insure that the gate structure 118 is protected. The spacers 142 may be formed by conformably depositing a layer of spacer material and thereafter performing an anisotropic etching process. Given the unique process flow disclosed herein, the replacements spacers 142 may be made of a more desirable low-k material (a material having a dielectric constant of about 3.9 or less). As noted above, by forming the replacement spacers 142 of a low-k material, the parasitic capacitance between the gate structure 118 and the conductive trench silicide structure (not shown in FIG. 3C) may be reduced, as compared to the situation where the spacers were made of a higher-k value material such as silicon nitride.

Figure 3D:
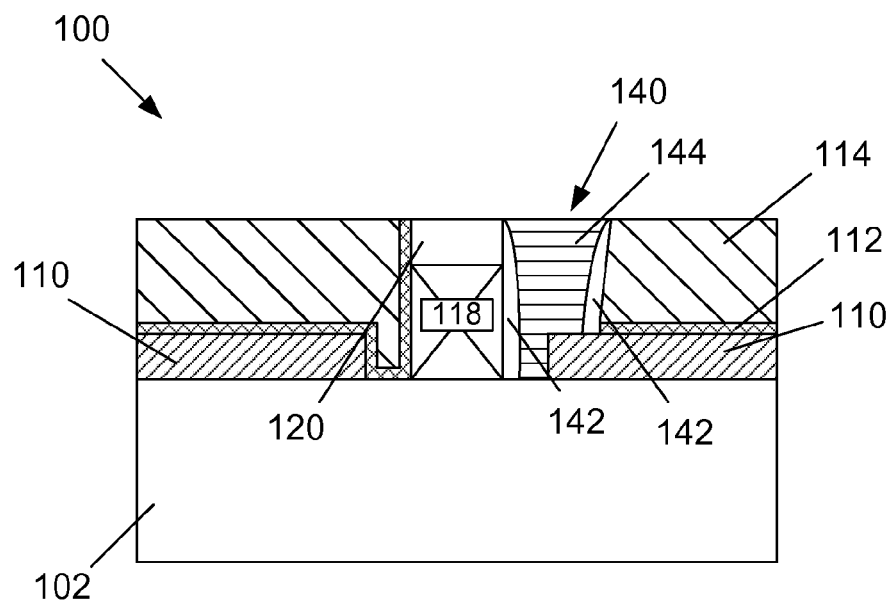

FIG. 3D depicts the device 100 after a conductive trench silicide structure 144 was formed in the trench silicide opening 140 such that it is conductively coupled to the source/drain region 110. The manner in which such conductive trench silicide structures 144 are formed is well known to those skilled in the art. The trench silicide structure 144 may also contain one or more barrier layers (not depicted), and, when present, such barrier layers should be considered to be part of the trench silicide structure 144. Eventually, a CMP process was performed to planarize the upper surface of the layer of insulating material 114 which results in the removal of excess material positioned outside of the trench silicide opening 140 and the formation of the trench silicide structure 144.

Figure 3E:
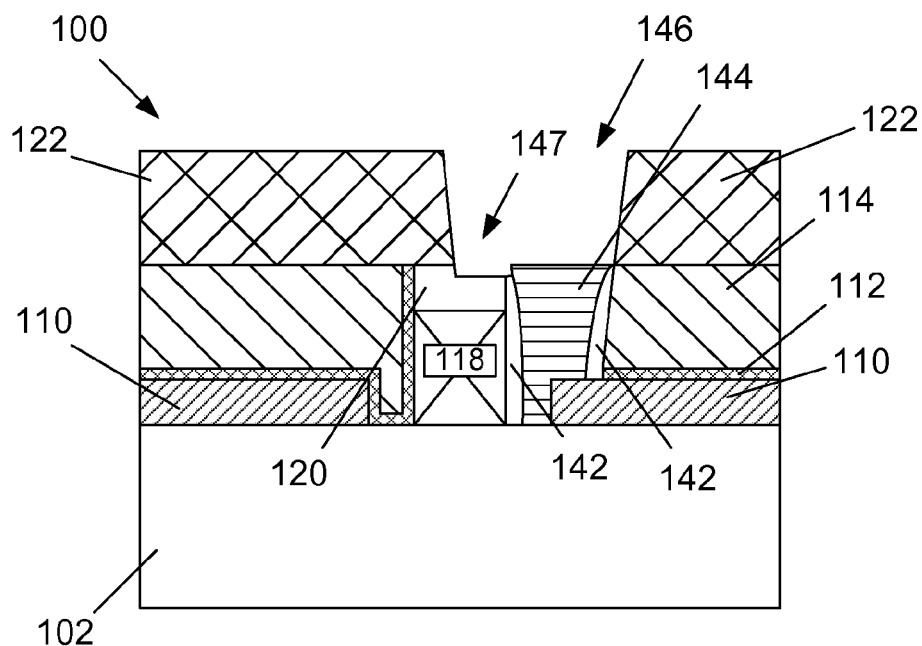

FIG. 3E depicts the device 100 after the above-described layer of insulating material 122 was deposited across the device 100, and after an etching process was performed through a patterned mask layer (not shown) to define a contact opening 146 in the layer of insulating material 122 that exposes the trench silicide structure 144. This contact etching process stops on the gate cap layer 120 and causes some loss of the cap layer 120, as depicted in the region 147. In the depicted embodiment, the contact opening 146 is substantially misaligned in comparison to the intended lateral location of the contact opening 146 relative to the location of the source/drain region 110 and the gate structure 118 of the device 100.

Figure 3F:
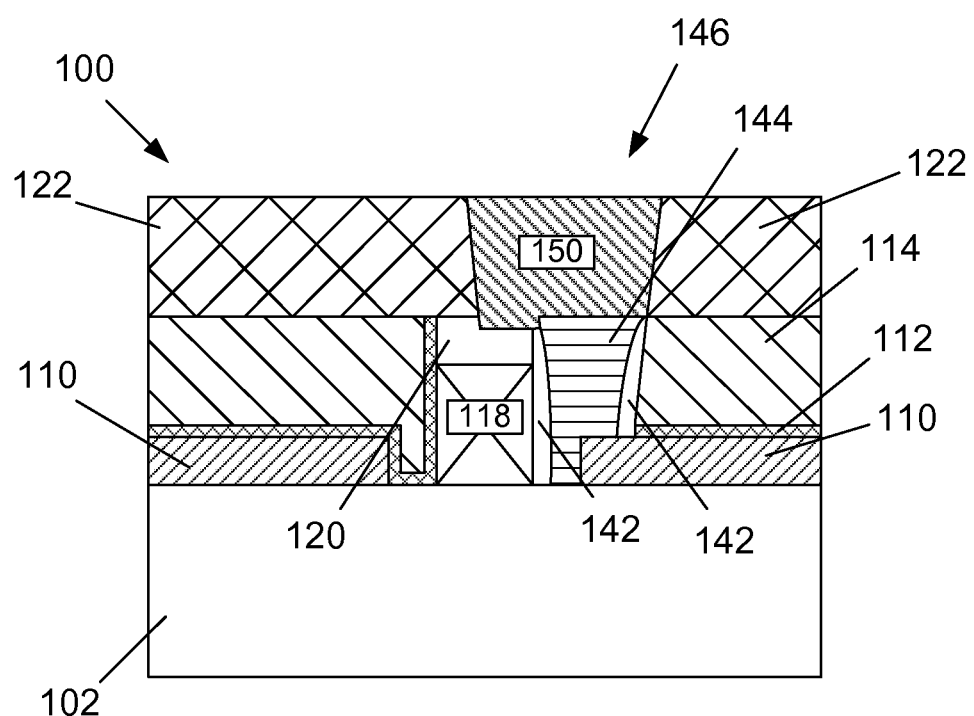

FIG. 3F depicts the device 100 after a contact structure 150 was formed in the contact opening 146 such that it is conductively coupled to the trench silicide structure 144. The contact structure 150 is intended to be schematic and representative in nature, as it may be formed using any of a variety of different conductive materials and by performing traditional manufacturing operations, such as those described above with respect to the contact structure 130.

Figure 4A:
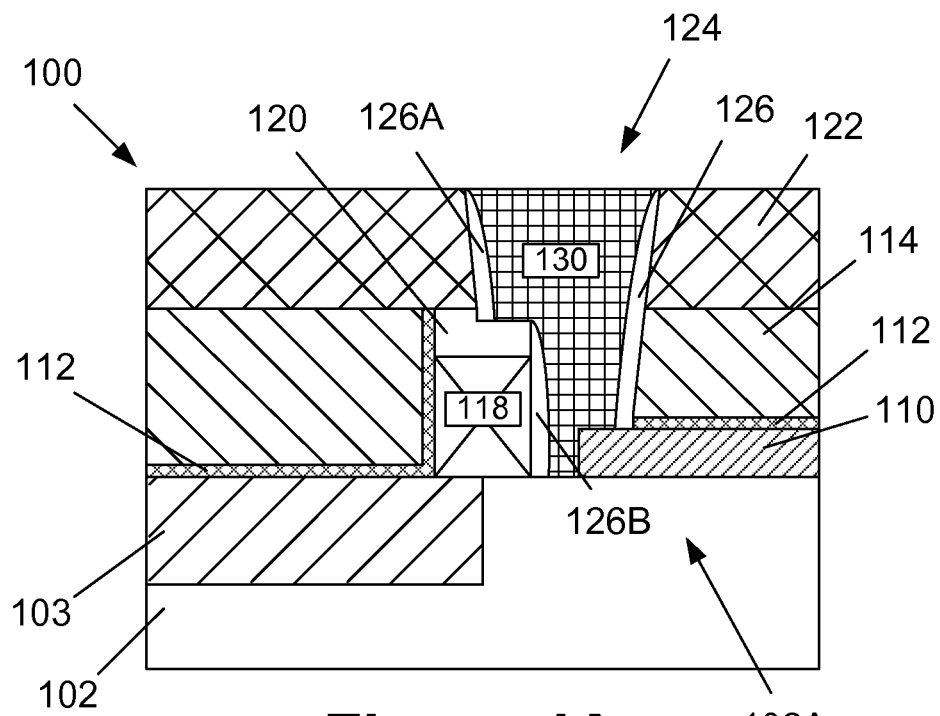
FIGS. 4A-4B depict one illustrative embodiment of a novel device disclosed herein.
Figure 4B:
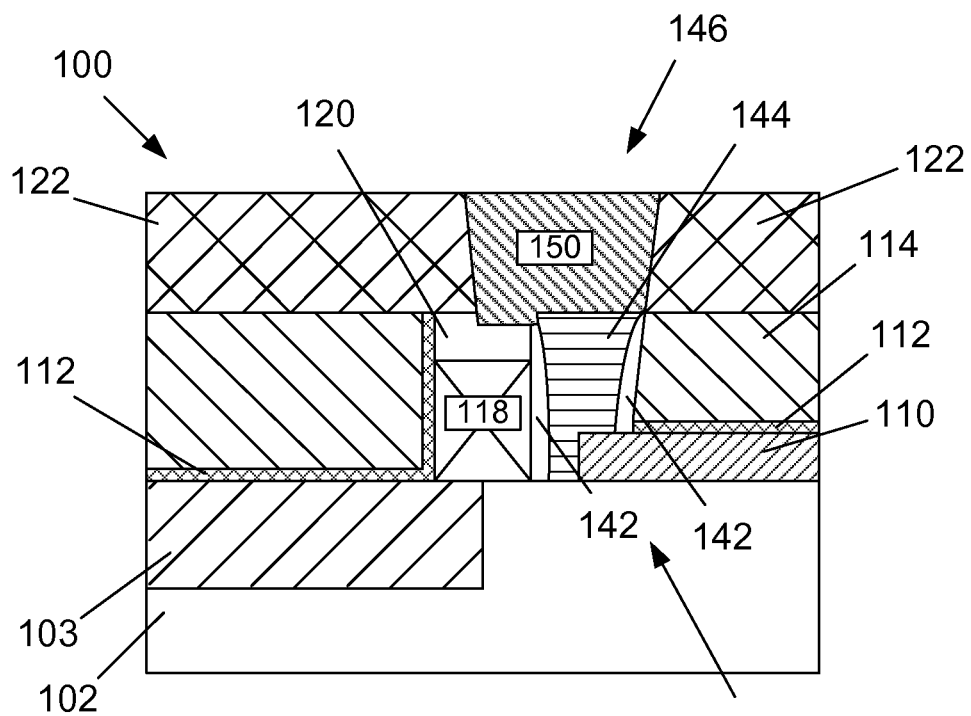

FIGS. 4A-4B depict one illustrative embodiment of a novel device disclosed herein. FIG. 4A-4B depict an example wherein the depicted gate structure 118 is a "dummy" gate structure that is formed partially on an isolation region 103 and partially on an active region 102A defined in the substrate 102 by the isolation region 103. That is, a first portion of the lateral width of the gate structure 118 is positioned above the isolation region 103, while a second portion of the lateral width of the gate structure 118 is positioned above the active region 102A. An active, functional gate structure that is formed above the active region 102A is not depicted in FIGS. 4A-4B. Of course, the depicted "dummy" gate structure may be used to form active gate structures above other active regions (not shown) defined in the substrate 102. As depicted in FIGS. 4A-4B, the epi material 110 is not formed on the isolation region 103. Thus, the portion of the etch stop layer 112 positioned above the isolation region 103 has a general "L" shaped configuration at this location in the integrated circuit product. As such, the novel device 100 includes a very thin "spacer" (a portion of the etch stop layer 112) on the left side of the gate structure 118 above the isolation region 103 and a relatively thicker low-k spacer 126B, 142 on the right side of the gate structure 118 above the active region 102A. Of course, as noted above, the etch stop layer 112 and the low-k spacers may be made of different materials. As depicted, the insulating material 114 is formed on the L-shaped liner, while a conductive structure, e.g., 130 or 144, is formed on the sidewall spacer. Additionally, the thickness of the L-shaped liner 112 on the gate structure 118 is less than the distance between the sidewall of the gate structure 118 and the edge of the epi material 110.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device, comprising:
    forming a structure above a semiconductor substrate, said structure comprising a sacrificial gate structure, a first gate cap layer positioned above said sacrificial gate structure and first sidewall spacers positioned adjacent said sacrificial gate structure;
    performing at least one etching process to remove said first sidewall spacers and said first gate cap layer so as to thereby expose an upper surface and sidewalls of said sacrificial gate structure;
    forming an etch stop layer above source/drain regions of said device and on said sidewalls and said upper surface of said sacrificial gate structure;
    forming a first layer of insulating material above said etch stop layer;
    removing said sacrificial gate structure so as to define a replacement gate cavity that is laterally defined by portions of said etch stop layer;
    forming a replacement gate structure in said replacement gate cavity;
    forming a second gate cap layer above said replacement gate structure;
    forming a first contact opening that extends through at least said first layer of insulating material so as to thereby expose at least a portion of said etch stop layer positioned on the sidewall of said replacement gate structure;
    performing an isotropic etching process to clear said sidewall of said replacement gate structure of said etch stop layer;
    after performing said isotropic etching process, forming a spacer in said first contact opening; and
    forming a first conductive contact in said first contact opening.

2. The method of claim 1, wherein said spacer is a low-k spacer (k value less than 3.9).

3. The method of claim 2, wherein performing said isotropic etching process exposes at least a portion of the sidewall of said replacement gate structure and wherein said spacer is formed on and in contact with said exposed portion of said sidewall of said replacement gate structure.

4. The method of claim 2, wherein forming said first conductive contact in said first contact opening comprises forming a conductive trench silicide contact in said first contact opening.

5. The method of claim 1, further comprising
    forming a second layer of insulating material above said second cap layer and said first conductive contact;
    forming a second contact opening that extends through at least said second layer of insulating material so as to thereby expose at least a portion of said first conductive contact; and
    forming a second conductive contact in said second contact opening, wherein said second conductive contact is conductively coupled to said first conductive contact.

6. The method of claim 5, wherein forming said first conductive contact in said first contact opening comprises forming a conductive trench silicide contact in said first contact opening.

7. The method of claim 5, wherein said spacer is a low-k spacer (k value less than 3.9).

8. The method of claim 5, wherein performing said isotropic etching process exposes at least a portion of the sidewall of said replacement gate structure and wherein said spacer is formed on and in contact with said exposed portion of said sidewall of said replacement gate structure.

9. The method of claim 1, wherein said replacement gate structure is comprised of a high-k gate insulation layer and at least one layer of metal.

10. A method of forming a transistor device, comprising:
forming a structure above a semiconductor substrate, said structure comprising a sacrificial gate structure, a first gate cap layer positioned above said sacrificial gate structure and first sidewall spacers positioned adjacent said sacrificial gate structure;
performing at least one etching process to remove said first sidewall spacers and said first gate cap layer so as to thereby expose an upper surface and sidewalls of said sacrificial gate structure;
forming an etch stop layer above source/drain regions for said device and on said sidewalls and on said upper surface of said sacrificial gate structure;
forming a first layer of insulating material above said etch stop layer;
removing said sacrificial gate structure so as to define a replacement gate cavity that is laterally defined by portions of said etch stop layer;
forming a replacement gate structure in said replacement gate cavity;
forming a second gate cap layer above said replacement gate structure;
forming a second layer of insulating material above said second gate cap layer;
forming a contact opening that extends through at least said first and second layers of insulating material so as to thereby expose at least a portion of said etch stop layer positioned on the sidewall of said replacement gate structure;
performing an isotropic etching process to clear said sidewall of said replacement gate structure of said etch stop layer;
after performing said isotropic etching process, forming at least one low-k spacer (k value less than 3.9) in said contact opening; and
forming a conductive contact in said contact opening.

11. The method of claim 10, wherein the first gate cap layer, the etch stop layer and the second gate cap layer are comprised of silicon nitride.

12. The method of claim 10, wherein performing the isotropic etching process exposes at least a portion of the sidewall of the replacement gate structure and wherein the at least one spacer is formed on and in contact with the exposed portion of the sidewall of the replacement gate structure.

13. A method of forming a transistor device, comprising:
forming a structure above a semiconductor substrate, the structure comprising a sacrificial gate structure, a first gate cap layer positioned above the sacrificial gate structure and first sidewall spacers positioned adjacent the sacrificial gate structure;
performing at least one etching process to remove the first sidewall spacers and the first gate cap layer so as to thereby expose an upper surface and sidewalls of the sacrificial gate structure;
forming an etch stop layer above source/drain regions for device and on the sidewalls and upper surface of the sacrificial gate structure;
forming a first layer of insulating material above the etch stop layer;
removing the sacrificial gate structure so as to define a replacement gate cavity that is laterally defined by portions of the etch stop layer;
forming a replacement gate structure in the replacement gate cavity;
forming a second gate cap layer above the replacement gate structure;
after forming the second gate cap layer, forming a first contact opening that extends through at least the first layer of insulating material so as to thereby expose at least a portion of the etch stop liner positioned on the sidewall of the replacement gate structure;
performing an isotropic etching process to clear the sidewall of the replacement gate structure of the etch stop liner;
after performing the isotropic etching process, forming at least one low-k spacer (k value less than 3.9) in the first contact opening;
after forming the at least one spacer, forming a first conductive contact in the first contact opening;
forming a second layer of insulating material above the second cap layer and the first conductive contact;
forming a second contact opening that extends through at least the second layer of insulating material so as to thereby expose at least a portion of the first conductive contact; and
forming a second conductive contact in the second contact opening, wherein the second conductive contact is conductively coupled to the first conductive contact.

14. The method of claim 13, wherein performing said isotropic etching process exposes at least a portion of said sidewall of said replacement gate structure and wherein said at least one low-k spacer is formed on and in contact with said exposed portion of said sidewall of said replacement gate structure.

* * * * *